United States Patent [19]

Damen et al.

[11] 4,323,618

[45] Apr. 6, 1982

[54] SINGLE CRYSTAL OF CALCIUM-GALLIUM GERMANIUM GARNET AND SUBSTRATE MANUFACTURED FROM SUCH A SINGLE CRYSTAL AND HAVING AN EPITAXIALLY GROWN BUBBLE DOMAIN FILM

[75] Inventors: Johannes P. M. Damen; Johannes A. Pistorius, both of Eindhoven, Netherlands

[73] Assignee: U.S. Philips Corporation, New York, N.Y.

[21] Appl. No.: 877,165

[22] Filed: Feb. 13, 1978

Related U.S. Application Data

[63] Continuation of Ser. No. 740,245, Nov. 8, 1976, abandoned.

[30] Foreign Application Priority Data

Jun. 16, 1976 [NL] Netherlands .................. 7606482

[51] Int. Cl.$^3$ .................................................. B32B 7/02
[52] U.S. Cl. ................................ 428/212; 156/616 A; 423/593; 423/594; 423/608; 423/624; 423/635; 428/900; 428/693; 365/33
[58] Field of Search ............................ 427/127–132, 427/48; 428/212, 539, 900; 423/593, 594, 608, 624, 635; 156/616 A

[56] References Cited

U.S. PATENT DOCUMENTS

| | | | |
|---|---|---|---|
| 3,723,599 | 3/1973 | Brandle, Jr. et al. | 423/263 |
| 3,736,158 | 5/1973 | Cullen et al. | 106/42 |
| 3,946,372 | 3/1976 | Henry et al. | 427/128 X |

FOREIGN PATENT DOCUMENTS 1477450 6/1977 United Kingdom .

OTHER PUBLICATIONS

IBM Technical Disclosure Bulletin, "Single Rare Earth Garnet Films for Bubble Domains," Giess et al., vol. 14, No. 7, Dec. 1971, p. 2221.

Primary Examiner—Bernard D. Pianalto
Attorney, Agent, or Firm—Marc D. Schechter

[57] ABSTRACT

A novel non-magnetic monocrystalline garnet substrate material in the form of calcium-gallium-germanium garnet. Single crystals of calcium-gallium-germanium garnet can be grown at mush lower temperatures by means of the Czocharalski method than single crystals of the conventional rare earth-gallium garnets. These single crystals are very suitable to epitaxially grow bubble domain films thereon, in particular films on the basis of $Lu_3Fe_5O_{12}$.

7 Claims, 4 Drawing Figures

SINGLE CRYSTAL OF CALCIUM-GALLIUM GERMANIUM GARNET AND SUBSTRATE MANUFACTURED FROM SUCH A SINGLE CRYSTAL AND HAVING AN EPITAXIALLY GROWN BUBBLE DOMAIN FILM

This is a continuation of application Ser. No. 740,245, filed Nov. 8, 1976 now abandoned.

The invention relates to a single crystal of non-magnetic synthetic garnet.

The use of single crystals of non-magnetic synthetic garnet, in particular of gadolinium-gallium garnet ($Gd_3Ga_5O_{12}$) as a substrate material for thin films of rare earth-iron garnet which are suitable for supporting magnetic bubble domains, is generally known. See, for example, Journal of Crystal Growth 12 (1972) pages 3-8, in which the growth of a number of garnet materials of different compositions is described.

With the discovery of a uniaxial anisotropy in rare earth-iron garnets by Bobeck c.s. (Appl. Phys. Letters 17 (3), 1970, page 131) it became necessary to manufacture thin films (1 μm to 10 μm) of these materials for which liquid phase epitaxy or vapour phase epitaxy seemed to be the best suitable techniques. In order to obtain good films, the lattice constant of the substrate should be matched to that of the film. When considering the range of lattice constants of the rare earth-iron garnets which have so far being used for bubbled domain devices, for example memories and shift registers, the lattice constants of rare earth-gallium garnets prove to occupy approximately the same range and hence they constitute suitable substrate materials. In addition, rare earth-gallium garnets are suitable materials to be prepared by means of the known crystal drawing technique by Czochralski. As already noted above, gadolinium-gallium garnet (GGG) is one of the substrate materials which are most frequently used nowadays.

In addition to their physical suitability, however, rare earth-gallium garnets, considered economically, have certain drawbacks. Since their melting points are high (for example, gadolinium-gallium garnet 1740° C.) iridium is to be used as a crucible material upon drawing single crystals by means of the Czochralski method. These crucibles are not only expensive, they also have a restricted life since they are damaged by the expansion of the garnet material upon melting to the required high temperature. In addition the oxygen-containing gas atmosphere in which the drawing takes place in general has a detrimental influence on the crucible used since volatile iridium oxide is formed. In these circumstances an iridium crucible can on an average be used twenty times only. Moreover, due to the high melting-points, the required electrical power is high.

An object of the invention is to provide an economically more attractive garnet substrate material which has a lower melting-point.

According to the invention, this problem is solved in that the single crystal of synthetic garnet material is calcium-gallium-germanium garnet.

The garnet material of this novel composition proves to have a considerably lower melting-point than the known rare earth-gallium garnets. Because the melting-point is only approximately 1380° C., platinum may be used as a crucible material when growing single crystals by means of the Czochralski method. The price of a platinum crucible is approximately $\frac{1}{3}$ of that of an iridium crucible. Moreover, the life is approximately $2\frac{1}{2} \times$ as long because the crucible is not apt to be damaged during melting the new garnet material. Due to the lower melting temperature of the novel garnet material, about only half of the electrical power is necessary in the growth process. An extra advantage is furthermore that the starting materials for the novel material are more widely available, while the price is approximately $\frac{2}{3}$ of that of the starting material for, for example, gadolinium-gallium garnet.

The general formula for the interesting garnet is $Ca_3Ga_2Ge_3O_{12}$, by which is stated a ratio of 8 metal atoms to 12 oxygen atoms, 25% of the number of metal atoms being occupied by Ga, 37.5% by Ca and 37.5% of Ge. This ratio provides a single crystal of garnet structure. Within certain limits, however, variations in this ratio may be provided without leaving the mono-phase existence range. When, however, said limits are exceeded, this results in the formation of undesired inclusions of alient phases and to low angle crystal boundaries, as a result of which the resulting crystal is unfit for the end in view.

The monophase existence range may roughly be characterized as being within the range of compositions for which it holds that 22-26% of the number of metal atoms is occupied by Ga, 37-39% by Ca and 37-39% by Ge.

As stated above, the present garnet single crystals are particularly suitable as substrates for rare earth-iron garnet films which can support magnetic bubble domains, although they may also be used for other applications, for example, as an insulating substrate material in semiconductor technology.

The invention also relates to a monocrystalline substrate of a non-magnetic synthetic garnet material which provides a surface on which a bubble domain film can be grown, said substrate being characterized in that the garnet material is calcium-gallium-germanium garnet, in particular having a composition within the above described range.

Bubble domain films can be manufactured by spinning, sputtering, liquid phase epitaxy or vapour phase epitaxy. As is known, a certain extent of adaptation should exist between the lattice constants of the bubble domain film and of the substrate material: the difference between the lattice constants (the misfit) should be smaller than 0.02 Å. The novel substrate material according to the invention has a lattice constant of approximately 12.25 Å.

The invention furthermore relates to a bubble domain device comprising a bubble domain film grown epitaxially on a crystallographic surface of a mono-crystalline synthetic garnet substrate, which device is characterized in that the substrate material is calcium-gallium-germanium garnet, in particular having a composition which lies within the above-described range.

A preferred embodiment of the bubble domain device according to the invention is characterized in that the calcium-gallium-germanium garnet substrate material has a lattice constant of approximately 12.25 Å and the bubble domain film has a lattice constant which deviates herefrom by at most 0.02 Å.

Bubble domain films having a composition on the basis of $Lu_3Fe_5O_{12}$ have a lattice constant which closely approaches the value of 12.25 Å. The desired value of the lattice constant can be adjusted very accurately by either substituting a small ion (for example Al or Ga) in an Fe position (the lattice constant then becomes smaller), or substituting a large ion (for example Eu or Y) in an Lu position (the lattice constant then becomes larger).

The invention therefore also relates to a bubble domain device as described above in which the bubble domain film has a composition on the basis of $Lu_3Fe_5O_{12}$.

The composition of the bubble domain film preferably satisfies the formula $(LuA)_3(FeB)_5O_{12}$, in which A=Y, Eu and B=Al, Ga or A=Ca, Sr, Mg, $Si^{2+}$ and B=Ge, $Si^{4+}$.

The invention will be described in greater detail with reference to the following examples, reference being made to the drawing.

DETAILED DESCRIPTION OF THE DRAWING

Figure 1:
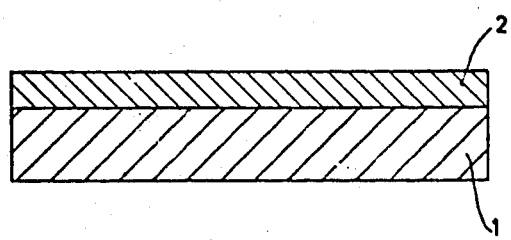
FIG. 1 is a sectional view of a monocrystalline calcium-gallium-germanium garnet substrate 1 having a bubble domain film 2 grown thereon.

It will be described hereinafter how first calcium-gallium-germanium garnet single crystals of a suitable composition are grown which may serve as a substrate 1 for a bubble domain 2 (FIG. 1) and how such bubble domain films are grown epitaxially.

For that purpose it was first found out by means of differential thermal analysis at what composition calcium-gallium-germanium garnet behaves as a monophase.

In this analysis method two platinum crucibles are used each having a cross-section of 4 mm and a height of 10 mm. Each crucible is placed on a platinum-platinum (90) rhodium (10) thermocouple. One crucible is filled with approximately 100 mg of a standard material, in this case powdered aluminum oxide. The other crucible is filled with approximately 100 mg of the material to be investigated. The distance between the crucibles is 10 mm. While being supported by an aluminum oxide holder they are placed in a vertical tube furnace having an inside diameter of 38 mm. The gas atmosphere is oxygen (1 bar). The furnace is heated at a rate of 700° C. per hour. The thermostress of the couple below the material to be investigated is recorded on a two-line recorder. This recorder also states the difference in thermostress between the two thermocouples. When during the heating an exothermal or endothermal effect occurred in the system, the difference signal will deviate from the zero value. In this manner melting temperatures, solidifying temperatures, phase variations and similar effects can be measured.

The results of the investigation carried out in the above-described manner in a number of calcium-gallium-germanium garnet samples of different compositions will be explained with reference to FIG. 2.

Figure 2:
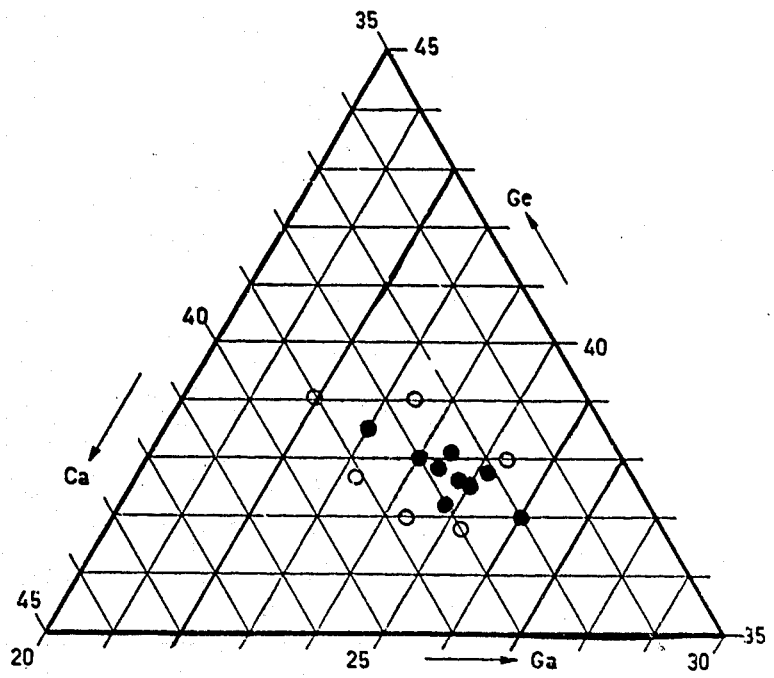
FIG. 2 shows a part of a ternary diagram in which a hatched region is indicated which approximately represents the monophase range of calcium-gallium-germanium garnet.

FIG. 2 shows a part of a ternary diagram in which various concentrations are shown as the percentage of metal atoms (Ca, Ga, and Ge, respectively) with respect to the overall number of metal atoms. The compositions which in this diagram are denoted by dots prove to give one exothermal peak upon melting at 1380° C. The compositions which are denoted by circles show more than one exothermal peak also at lower temperatures. (The foreign phases occurring in this case have not been further investigated). From the figure the conclusion may be drawn that the monophase existence range can roughly be characterized as being within the range which is bounded by the lines 37 Ca and 39 Ca and the lines 37 Ge and 39 Ge, the extreme corner points being determined by the lines 22 Ga and 26 Ga. In other words, the existence range lies within the range of compositions for which it holds that 22-26% of the number of metal atoms is occupied by Ga, 37-39% by Ca and 37-39% by Ge.

The range of compositions which is of interest can be approached also by means of a formula in which case it holds that the composition of the calcium-gallium-germanium garnet must satisfy the formula

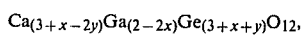

$$Ca_{(3+x-2y)}Ga_{(2-2x)}Ge_{(3+x+y)}O_{12},$$

in which
$-0.032 \leq x \leq 0.112$
$-0.032 \leq y \leq 0.032$
on the understanding that when x assumes an extreme value, y is zero, and conversely.

From the figure it appears that the range is rather narrow and extends from the composition $Ca_3Ga_2Ge_3O_{12}$ (25% Ga, 37.5% Ca, 37.5% Ge) mainly in the Ga-poor direction. This latter suggests that 2x Ga ions can be replaced by x Ca ions and x Ge ions. Thus 11% of the octahedron places can be occupied by equal numbers of Ca ions and Ge ions. On the other hand, 1% of the dodecahedron places and 1% of the tetrahedron places can simultaneously be occupied by Ga ions. The width of the range permits of increasing the number of Ca or Ge ions by a few percent and that said extra ions can be placed in released Ga places.

A number of single crystals are then grown by means of the Czochralski method.

EXAMPLE 1

In order to obtain a $Ca_3Ga_2Ge_3O_{12}$ single crystal, 97.59 g of calcium carbonate ("Suprapur"; Merck), 60.92 g of gallium oxide (99.99% pure; Alusuisse), and 101.98 g of germanium oxide (99.9999% pure; Vieille Montagne) were mixed in the dry condition and compressed to tablets in a perspex die. The tablets were weighed in a platinum crucible and heated to a temperature of approximately 1380° C., the melting point of the mixture. Heating was carried out by coupling the crucible to a HF induction heating device having a power of 6 kW. The crucible and its contents were then allowed to reach a temperature at which the contents were completely liquid. The gas atmosphere was oxygen (1 bar). Growth may also be carried out, if desired, in an oxygen-containing atmosphere, for example, in an air-oxygen mixture. When the contents of the crucible had just melted, a seed crystal which was secured to an aluminum oxide rod was dipped in the melt and the Czochralski drawing method was used for causing a single crystal of calcium-gallium-germanium garnet to grow to a height of 40 mm at a growth rate of 6 mm per hour and a speed of rotation of 25 rpm.

Although calcium-gallium-germanium garnet can readily be used for the growth of single crystals by means of the Czochralski method, other growth techniques, for example hydrothermal growth, zone melting or the Bridgeman technique, may also be used.

EXAMPLE 2

In order to obtain a $Ca_{2.98}Ga_{1.94}Ge_{3.05}O_{12}$ single crystal (in which thus in the formula 37.35% of the number of metal atoms is occupied by Ca, 24.35% by Ga and 28.30% by Ge) 97.20 g of calcium carbonate, 59.34 g of gallium oxide and 104.15 g of germanium oxide were mixed in the dry condition. In the same manner as described in example 1, a garnet crystal was drawn from this mixture after it had melted.

EXAMPLE 3

In order to obtain a $Ca_{2.98}Ga_{1.97}Ge_{3.03}O_{12}$ single crystal (in which thus in the formula 37.40% of the number of metal atoms is occupied by Ca, 24.60% by Ga and 38.00% of Ge), 97.33 g of calcium carbonate, 59.94 g of gallium oxide and 103.33 g of germanium oxide were mixed in the dry condition. In the same manner as described in example 1, a garnet crystal was drawn from this mixture after it had melted.

EXAMPLE 4

In order to obtain a $Ca_{3.04}Ga_{1.92}Ge_{3.04}O_{12}$ single crystal (in which thus in the formula 38.00% of the number of metal atoms is occupied by Ca, 24.00% by Ga and 38.00% by Ge), 98.89 g of $CaCO_3$, 58.48 g of $Ga_2O_3$ and 103.33 g of $Ge_2O$ were mixed in the dry condition. In the same manner as described in Example 1, a garnet single crystal was drawn from this mixture after it had melted.

EXAMPLE 5

In order to obtain a $Ca_{2.99}Ga_{1.95}Ge_{3.04}O_{12}$ single crystal (in which thus in the formula 37.45% of the number of metal atoms is occupied by Ca, 24.45% by Ga and 38.10% by Ge), 100.00 g of $CaCO_3$, 61.16 g of $Ga_2O_3$ and 106.31 g of $Ge_2O_3$ were mixed in the dry condition. In the same manner as described in Example 1, a garnet single crystal was drawn from this mixture after it had melted.

The lattice constant of the calcium-gallium-germanium garnet single crystals grown in the above-described manner is 12.25 Å. From these crystals disks were sawed having a diameter of 20 mm and a thickness of 600 μm, which disks were then polished to a thickness of 400 μm with diamond powder and then with a known polishing agent. As a result of the larger softness, sawing and polishing could be carried out more easily than in rare earth-gallium garnets.

EXAMPLE 6

On a given crystallographic face of the disks obtained in the above-described manner, bubble domain films having the composition $(LuEu)_3Fe_{3.8}Al_{1.2}O_{12}$ were grown by means of liquid phase epitaxy. The basic composition of the melt from which the films were grown was;

343.95 g: PbO
9.60 g: $B_2O_3$
3.75 g: $Lu_2O_3$
27.81 g: $Fe_2O_3$
1.40 g: $Al_2O_3$
p g: $Eu_2O_3$

In the table below a few growth parameters are stated of films grown from the above-mentioned basic melt on substrate disks dipped therein vertically. The quantity of $Eu_2O_3$ in the melt was varied:

| P (gram) | dipping time (minutes) | dipping temp. (°C.) | misfit (λ) | thickness (μm) | $K_u$ (erg $cm^{-3}$) | $4\pi M$ (Gauss) |
|---|---|---|---|---|---|---|
| 1.10 | 20 | 915 | +0.003 | 5.68 | $1.2 \times 10^{-4}$ | 136 |
| 1.21 | 20 | 915 | 0.000 | 6.03 | $0.8 \times 10^{-4}$ | 150 |
| 1.30 | 20 | 916 | −0.013 | 8.74 | $1.4 \times 10^{-4}$ | 170 |
| 1.39 | 20 | 928 | −0.016 | 6.78 | $1.4 \times 10^{-4}$ | 150 |

Film growth experiments have demonstated that calcium-gallium-germanium garnet is readily suitable to grow bubble domains thereon. It does not dissolve in the melt, it presents a good interface, the coercive field of the grown films is small (smaller than 0.5 Oersted). The films themselves had satisfactory bubble domain qualities, comparable, for example, to those of $(YLa)_3(FeGa)_5O_{12}$ films.

EXAMPLE 7

A second series of film growth experiments was carried out with films of the composition $(LuCa)_3(FeSi)_5O_{12}$. On a number of disks obtained in the above-described manner, bubble domain films were grown on a given crystallographic face (in the present case the 111 face) by means of liquid phase epitaxy from a basic melt of the composition 400.0 g: PbO
10.0 g: $B_2O_3$
33.36 g: $Fe_2O_3$
4.35 g: $Lu_2O_3$
3.25 g: $CaCO_3$
3.52 g: $SiO_2$
0.20 g: $GeO_2$.

In a representative case the dipping time was 20 minutes and the dipping temperature was 828° C. The film grown in these conditions had a thickness of approximatey 5 μm and a misfit of 0.009 Å. The magnetic properties were characterized by a value of the anisotropy $K_u$ of $2.6 \times 10^{-4}$ erg $cm^{-3}$ and a value of the saturation magnetisation $4\pi M_s$ of 119 Gauss. The growth itself could be carried out as easily as the growth of the films of the type described in Example 6.

Figure 3:
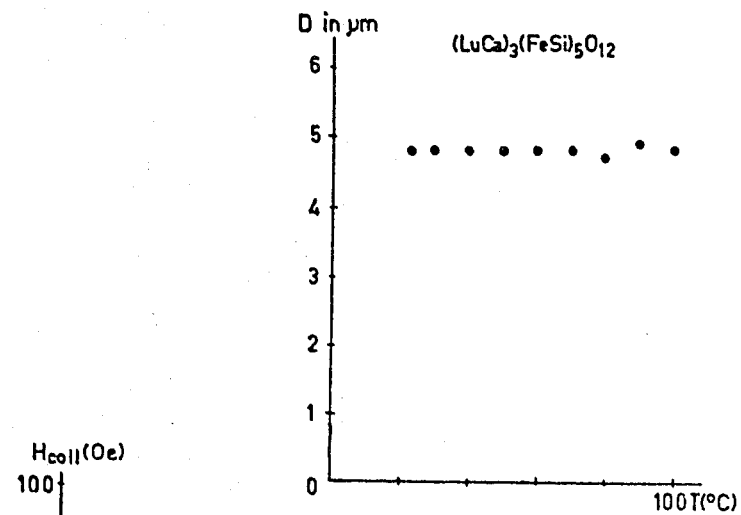
FIG. 3 shows a graph which indicates the diameter D of a bubble domain generated in the film 2 of FIG. 1 as a function of the temperature.
Figure 4:
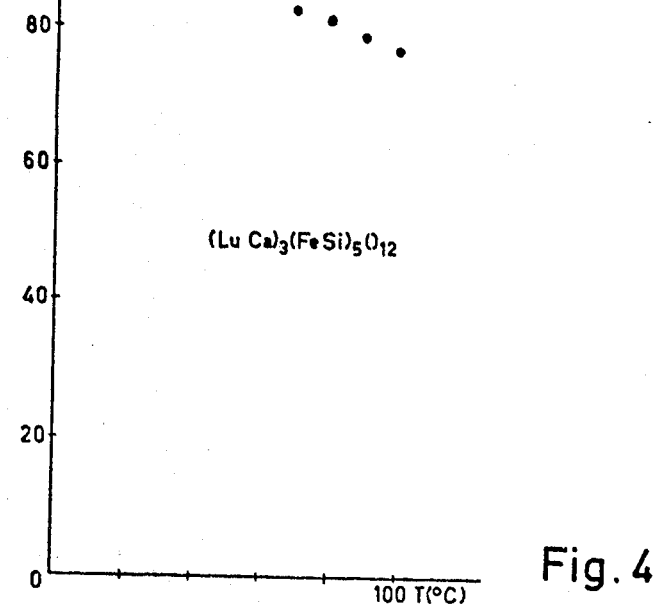
FIG. 4 shows a graph which indicates the collapse field $H_{coll}$ of a bubble domain generated in the film 2 of FIG. 1 as a function of the temperature.

The magnetic properties of a film of the type of Example 7 are shown in FIGS. 3 and 4. From FIG. 3 it appears clearly that the diameter D of a bubble domain generated in such a film is substantially independent of the temperature. From FIG. 4 it appears that the collapse field $H_{coll}$ does slightly depend upon the temperature but not to too a considerable extent. Further experiments have demonstrated that the bubble domains are stable up to approximately 110° C. Thus films of the type of example 7 are readily suitable for use in operational bubble domain devices.

Included in the group of films of the type of Example 7 are those garnet films in which a double substitution of bivalent and quadrivalent ions has taken place in contrast with the single substitution of Al or Ga in garnet films of the type of Example 6. (In that case otherwise Al is to be preferred because it has the smallest ion radius.) Substitutions which are to be considered are $Ca^{2+} Ge^{4+}$; $Ca^{2+} Si^{4+}$; $Si^{2+} Ge^{4+}$; $Sr^{2+} Si^{4+}$; $Mg^{2+} Ge^{4+}$, $Mg^{2+} Si^{4+}$. The substitution of $Ca^{2+} Si^{4+}$ has been described in Example 7 and leads to a film which is readily adapted to the substrate (misfit 0.009 Å) and a value of the saturation magnetisation which permits the generation of bubble domains having a diameter between 1 and 6 μm.

It is to be noted that in the above examples the composition of the bubble domain films has been chosen to be so that within certain limits their lattice constants have been adapted to those of the available substrates which is 12.25 Å. However, it is alternatively possible by means of certain substitutions to vary the lattice constant of the calcium-gallium-germanium garnet. For example, the substitution of strontium in the gallium position makes the lattice constant larger and the substitution of silicon in the germanium position makes the lattice constant smaller.

What is claimed is:

1. A single crystal of a non-magnetic synthetic garnet material, characterized in that the garnet material is calcium-gallium-germanium garnet.

2. A bubble domain device comprising a bubble domain film grown epitaxially on a crystallographic face of a monocrystalline garnet substrate, the substrate material consisting of calcium-gallium-germanium garnet having a melting point of about 1380° C.

3. A bubble domain device as claimed in claim 2, wherein the substrate material is monocrystalline calcium-gallium-germanium garnet, 22–26% of the number of metal atoms consisting of Ga, 37–39% of the number of metal atoms consisting of Ca, and 37–39% of the number of metal atoms consisting of Ge.

4. A bubble domain device as claimed in claim 3, wherein the calcium-gallium-germanium garnet material has a lattice constant of approximately 12.25 Å, the bubble domain film having a lattice constant which deviates therefrom by at most 0.02 Å.

5. A bubble domain device as claimed in claim 4, wherein the bubble domain film has a composition on the basis of $Lu_3Fe_5O_{12}$.

6. A bubble domain device as claimed in claim 4, wherein the composition of the bubble domain film satisfies the formula $(LuA)_3(FeB)_5O_{12}$, in which
A=Y, Eu and B=Al, Ga,
or A=Ca, Sr, Mg, $Si^{2+}$ and B=Ge, $Si^{4+}$.

7. A bubble domain device as claimed in claim 2 wherein the composition of the calcium-gallium-germanium garnet is $Ca_3Ga_2Ge_3O_{12}$.

* * * * *